United States Patent [19]

Grinn et al.

[11] Patent Number: 4,675,808
[45] Date of Patent: Jun. 23, 1987

[54] MULTIPLEXED-ADDRESS INTERFACE FOR ADDRESSING MEMORIES OF VARIOUS SIZES

[75] Inventors: James M. Grinn, Warrenville; Kevin A. McWethy, Lisle, both of Ill.

[73] Assignee: American Telephone and Telegraph Company AT&T Bell Laboratories, Murray Hill, N.J.

[21] Appl. No.: 521,401

[22] Filed: Aug. 8, 1983

[51] Int. Cl.⁴ .................... G06F 12/00; G11C 8/00
[52] U.S. Cl. .................... 364/200; 365/230
[58] Field of Search ... 364/200 MS File, 900 MS File; 365/230, 236, 239, 189

[56] References Cited

U.S. PATENT DOCUMENTS

| | | | |
|---|---|---|---|
| 3,969,706 | 7/1976 | Proebsting et al. | 340/173 R |
| 4,306,298 | 12/1981 | McElroy | 364/900 |
| 4,374,410 | 2/1983 | Sakai et al. | 364/200 |
| 4,435,792 | 3/1984 | Bechtolsheim | 365/230 |
| 4,447,878 | 5/1984 | Kinnie et al. | 364/200 |
| 4,449,207 | 5/1984 | Kung et al. | 365/230 |
| 4,468,731 | 8/1984 | Johnson et al. | 364/200 |
| 4,471,458 | 9/1984 | Weilbacker et al. | 364/900 |
| 4,472,792 | 9/1984 | Shimohigashi et al. | 365/189 |
| 4,513,372 | 4/1985 | Ziegler et al. | 364/200 |
| 4,541,078 | 9/1985 | Dumbri et al. | 365/230 |
| 4,566,082 | 1/1986 | Anderson | 365/230 |

FOREIGN PATENT DOCUMENTS

| | | |
|---|---|---|
| 0030007 | 6/1981 | European Pat. Off. |
| 2091008 | 7/1982 | United Kingdom |

OTHER PUBLICATIONS

Mitsubishi "Address Conversion System", *Patent Abstracts of Japan*, vol. 4, No. 5 (E-165), p. 74E165 (Jan. 16, 1980).

Hitachi "Memory Device", *Patent Abstracts of Japan*, vol. 1, No. 153, p. 8187E77 (Dec. 8, 1977).

*Primary Examiner*—Archie E. Williams
*Assistant Examiner*—Thomas L. Lee
*Attorney, Agent, or Firm*—David Volejnicek

[57] ABSTRACT

Disclosed is a computer system (FIG. 1) that is operable with any multiplexed-address memory (200) within a size range of $2^N$ to $2^{N+R}$ memory locations (211). The system has a memory of $2^S$ locations selected from the predetermined range, and the memory has S/2 multiplexed address input terminals (231). Address bits forming a memory address, generated for example by a processor (400), are multiplexed by a memory controller (300) onto N/2+R address output terminals (314) in two sets of N/2+R address bits. The address bit sets have at least R/2 bits in common. An address bus (250) transports the multiplexed address bits to the memory. The bus has N/2+R address leads (251) connected to the output terminals of the memory controller. S/2 of those address leads are also connected to the address input terminal of the memory. The remaining address leads are not connected. The memory controller multiplexes the address of any memory within the predetermined range onto its output terminals. Addressing of a different-size memory requires merely connecting the memory to the appropriate address leads of the multiplexed-address bus.

12 Claims, 3 Drawing Figures

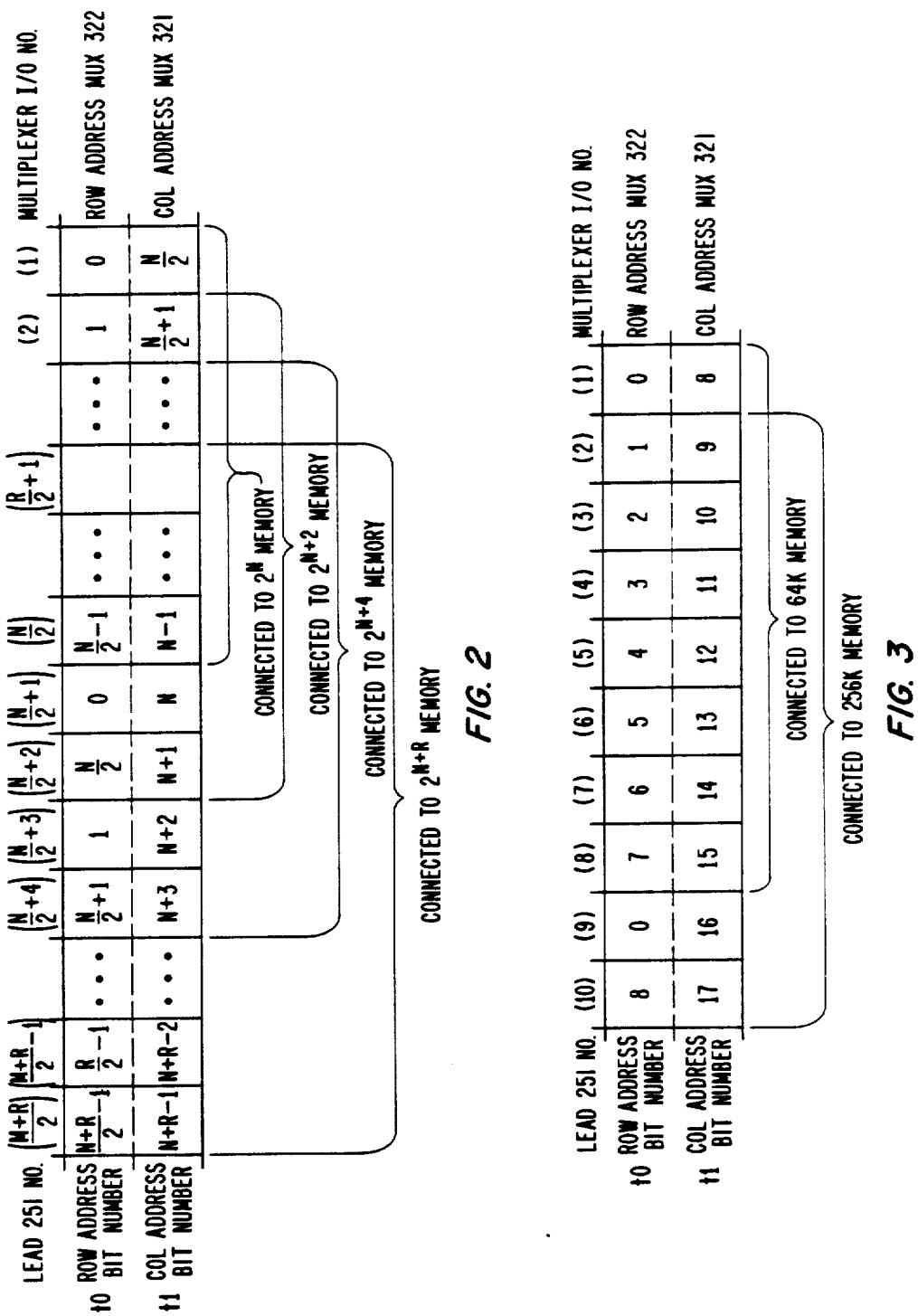

MULTIPLEXED-ADDRESS INTERFACE FOR ADDRESSING MEMORIES OF VARIOUS SIZES

TECHNICAL FIELD

This invention relates to data storage systems in general, and to the addressability of various sizes of memory devices in such systems via a multiplexed-address interface in particular.

BACKGROUND OF THE INVENTION

Many types of memory devices, for example core memories and semiconductor memories, comprise matrices of memory cells. Memory cells in a matrix are logically arranged in rows and orthogonal columns. A particular memory cell can therefore be addressed in such a matrix by specifying the address of the row and the address of the column in which the cell is located.

The trend in memory device manufacture is to increase their density and complexity while reducing their size. Paradoxically, such devices generally require more input and output signal terminals yet have less room for accommodating such terminals than earlier devices.

To avoid the necessity of having separate terminals on a memory device for both row-address leads and column-address leads, row addresses and column addresses may conveniently be input to a memory device on the same terminals in a time-multiplexed manner, i.e., sequentially, one address at a time. The multiplexed address signals are brought to the memory device over a bus whose leads attach to the address input terminals of the memory device.

Memory devices are made in various sizes in terms of the numbers of memory cells which they contain. Different-size memory devices require different-size addresses to uniquely address each of the memory cells. Therefore different-size address buses and multiplexing mechanisms are generally required to bring the addresses to the various memory devices.

In systems that utilize memory devices, it is often desirable to permit the use of any one of a number of sizes of memory devices. One reason for this is that the product lifetime of the system, such as a computer, may span a decade, while the interval between subsequent improvements in memory density due to technological advances may be only a couple of years. The increases in memory density typically bring about corresponding decreases in memory cost per bit, hence the use of latest technology memories with existing systems is economically justifiable and desirable.

One way of achieving the capability of using different size memories in a system is to change the address bus and the bus-multiplexing mechanism each time a memory device of a different size is used in such a system. However, this approach is impractical because of the time, expense, and skill required for such change.

A second approach to enabling use of memory devices of various sizes in such systems is to equip the systems with address buses and bus-multiplexing mechanisms adapted for use with the largest memory devices that can be used in the system, and providing along therewith adaptive circuitry that selectively modifies the operation of these buses and multiplexing mechanisms to adapt them for use with smaller memory devices. However, the adaptive circuitry adds to the size and cost of the system. The adaptive circuitry also dissipates power, and hence it requires the use of larger and more expensive power supplies and larger and more expensive cooling systems. And the circuitry adds a delay to signals propagating between the memory and devices communicating therewith, thereby slowing down the operation of the system and adversely affecting system performance. Furthermore, adaptive circuitry quickly becomes extensive and complex with increases in the number of sizes of memory devices that it is to handle. Thus the adaptive circuitry can add significantly to the size, cost, and complexity of storage systems while at the same time decreasing their performance.

SUMMARY OF THE INVENTION

It is these and other disadvantages of the prior art that the invention is directed to solving.

According to the invention, in an information storage system for storing information in, or retrieving stored information from, any storage device whose multiplexed-address input terminals number within a predetermined non-zero range of different pluralities of address input terminals, an address-interfacing apparatus has a mechanism with a plurality of output terminals for multiplexing thereon storage addressed of the storage devices whose multiplexed-address input terminals number within the range, and a mechanism for connection between the input terminals of the storage device that is in use in the system and those of the output terminals of the multiplexing device that have multiplexed thereon an address of that storage device, for transporting to the storage device its multiplexed addresses.

Preferably, the storage device is a memory having a first plurality of input terminals for receiving thereon a first and a second multiplexed set of address bits that together form an address of the memory, and the memory is selected from a plurality of memories that have a predetermined non-zero range of first pluralities of input terminals. The multiplexing mechanism has a second plurality, greater than the largest first plurality, of output terminals for multiplexing thereon a third and a fourth set of address bits that include the first and the second set, respectively, and that together form memory addresses of all memories of the plurality of memories. The third and the fourth set have at least one address bit in common. And the transporting mechanism is for connection between the first plurality of the address input terminals of the memory and a first plurality of output terminals comprising those output terminals that have the first and the second set of address bits multiplexed thereon without duplication of any of the bits and the second set of address bits.

Advantageously, the inventive scheme gives great versatility to systems in terms of the sizes of memory devices that the systems can use, without adding significantly to the size, cost, or complexity of the systems, and without degrading their performance. The inventive scheme allows a single, common, multiplexed-address bus and multiplexing circuitry associated therewith to be used with virtually any number of sizes of memory devices. The scheme does not add specialized adaptive circuitry, aside from extra address-bus leads, to a system that utilizes it. Thus the scheme does not introduce a performance-impairing signal propagation delay to the system. The scheme is generally inexpensive to implement, in comparison to the cost of adding adaptive circuitry of equivalent versatility to a system. The scheme is passive: it does not consume power, and hence avoids disadvantages associated with increased power dissipation. The scheme is simple to implement and use, and thus avoids disadvantages associated with implementing and using adaptive schemes of greater complexity. And the scheme is compact, requiring little circuit board space for its implementation, and hence it avoids disadvantages associated with increasing the size of systems that use it.

These and other advantages and features of the invention will become apparent from the following description of an illustrative embodiment of the invention, taken together with the drawing.

BRIEF DESCRIPTION OF THE DRAWING

FIG. 2 is a logical block diagram of the interconnection scheme of a generalized multiplexed-address bus and address multiplexer of the system of FIG. 1; and FIG. 3 is a logical block diagram of an illustrative embodiment of the interconnection scheme of the multiplexed-address bus and address multiplexer of FIG. 2.

DETAILED DESCRIPTION

Figure 1:
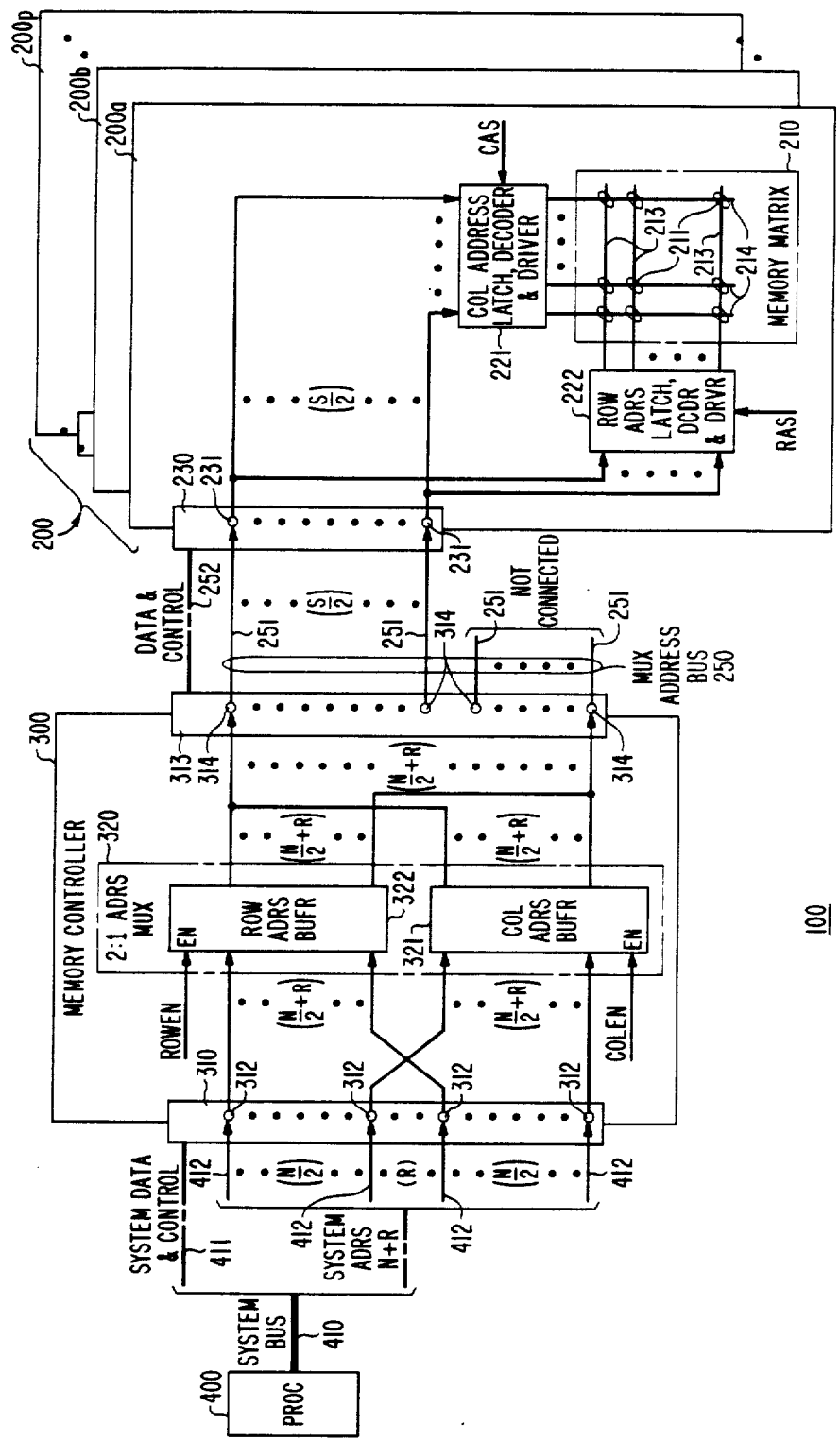
FIG. 1 is a block diagram of a storage system embodying an illustrative example of the invention.

Turning now to the drawing, FIG. 1 shows a computer 100 which incorporates an embodiment of the present invention. The computer 100 is only one type of information storage system that can utilize the present invention. Therefore, while the invention will be discussed in the context of the computer 100, it will be understood that the invention is not limited thereto.

The computer 100 includes a processor 400 and a memory 200. The computer 100 is adapted to operate with any-size memory 200 within a predetermined range of memory sizes, and the size of the memory 200 that is being used may be changed. The memory 200 stores information, under control of devices such as the processor 400, at locations specified by addresses supplied thereto by those devices. The processor 400 commands the memory 200 to store information in and retrieve information from memory locations specified by addresses which it generates and supplies to the memory 200. The processor 400 may generate the addresses directly, or indirectly by receiving them from other devices and forwarding them to the memory 200. For purposes of this illustrative embodiment, the processor is considered to be the source of all memory addresses in the computer 100.

The processor 400 communicates with the memory 200 over a system bus 410. The memory 200 is interfaced to the system bus 410 via a memory controller 300. Other devices (not shown) may likewise be connected to the system bus 410 for communication with the memory 200 and/or the processor 400. The system bus 410 includes a plurality of leads 411 for carrying data and various control information, and a plurality of leads 412 for carrying address bits.

Alternatively, the data, control, and address information may be multiplexed onto the same set of system bus leads.

The number of address leads 412 generally determines the maximum number of memory address bits, and hence the maximum address size that can be conveyed through the computer 100. Therefore the number of address leads 412 generally determines the maximum size of memory that the computer 100 can utilize. Thus, if the system bus 410 is assumed to include M address leads 412, as indicated in FIG. 1, the computer 100 can generally utilize memories in sizes of up to $2^M$ locations. Of course, multiplexing techniques may be used to send more than one address bit over a single lead 412 and thus increase the size of memory that can be addressed over any given number of address leads 412. But for the sake of simplifying the discussion, it is assumed that addresses are not multiplexed on the leads 412.

Memories of sizes of fewer than $2^M$ locations may be addressed either by generating addresses having fewer than M bits and conveying these over selected ones of the leads 412, or simply by ignoring selected, i.e., the most significant, address bits of the address whose bit size exceeds the requirements of the memory.

The memory 200 is the information storage device of the computer 100. The memory 200 is logically organized as a three-dimensional array of memory cells 211. The array is addressable along two dimensions, with the third dimension representing the size of, or number of cells 211 included in, each addressable location of the memory 200. The memory locations are commonly referred to as bytes or words of memory. A two-dimensional matrix 210 of memory cells 211 having one cell 211 of each addressable memory location is commonly implemented on a single one of the memory devices 200a–200p. The devices 200a–200p are identical. The devices 200a–200p are connected in parallel to form the three-dimensional memory array, and as many devices 200a–200p are connected in parallel as is the desired width of a memory location. Because the structure and operation of the devices 200a–200p is the same, for purposes of simplifying the discussion, the memory 200 will be henceforth described in terms of a single device 200a. Also, the discussion pertaining to a cell 211 in such a device 200 as will be understood to likewise pertain to a location in the three-dimensional array of the memory 200, and vice versa.

Memories suitable for use as the memory 200 are conventionally implemented in sizes of $2^S$ memory locations, where S is a positive integer. Logically, such memory 200 is configured as an S/2 row-by-S/2 column matrix 210 of memory cells 211, if S is an even integer. If S is an odd integer, the logical configuration of the matrix 210 is (S+1)/2 row-by-(S−1)/2 columns, or (S−1)/2 rows-by-(S+1)/2 columns. The rows and columns represent the two dimensions of addressability of the memory 200.

The rows and columns of cells 211 are interwoven by row address leads 213 and column address leads 214 such that each cell 211 has a pair of leads 213 and 214 woven through it. Activation of both leads 213 and 214 running through a cell 211 results in the cell 211 being addressed, or selected. Logically, one of the leads 213 running through a cell 211 is associated with the row of the cell 211 and the other lead 214 is logically orthogonal to the first and is associated with the column of the cell 211. The respective row and column leads 213 and 214 are selected and driven by a row address latch, decoder, and driver 222 and a column address latch, decoder, and driver 221.

Inputs of the circuits 221 and 222 are connected in parallel to address-input terminals 231 of an input port 230 of the memory 200. The terminals 231 are in turn connected to leads 251 of a multiplexed address bus 250 which transports addresses from the memory controller 300 to the memory 200.

Each of the circuits 221 and 222 has a strobe input. The strobe input of the circuit 221 is connected to a source (not shown) of column address strobe (CAS)

signals and the enable input of the circuit 222 is connected to a source (not shown) of row address strobe (RAS) signals. Upon receiving a strobe input signal, at some time t=0, circuit 222 latches-in address signals present at the address-input terminals 231, decodes the address, and activates the corresponding address lead 213. Subsequently, at some later time t=1, the circuit 221 receives a strobe input signal, and in response it likewise latches-in the address signals present at the address input terminals 231, decodes the address, and activates the corresponding address lead 214. The cell 211 which has both activated address leads 213 and 214 running through it is thus addressed.

A memory of size $2^S$ locations requires a set of S/2 row-address bits and a set of S/2 column-address bits to uniquely address a selected memory location, if S is an even integer. Hence the memory of size $2^S$ locations requires S/2 multiplexed-address input terminals 231 to receive those two sets of address bits. If S is an odd integer, (S+1)/2 terminals 231 are required to receive both sets of address bits. In other words, the required number of terminals 231 is the smallest integer not smaller than S/2. This is the same number of address terminals 231 required by a memory of size $2^{S+1}$ locations where S+1 is an even integer. Hence a memory of size of $2^S$ locations such that S is an odd integer is for purposes of this invention treated as a memory of the next-larger size $2^S$ where S is an even integer. Therefore, S will be assumed to take on even integer values only, and any discussion of a value of S will be understood to subsume the case of the next-smaller odd-integer value.

To permit use of memories of various sizes in the computer 100, and to allow the memory 200 that is being used to be easily exchanged for a memory 200 of a different size, the multiplexed-address bus 250 is adapted for connection to any size memory within a predetermined range of sizes. The bus 250 includes leads 251 that carry redundant address-bit information. Memories of different sizes within the predetermined size range are connected to different subsets of leads 251 of the bus 250, and the remaining leads 251 of the bus 250 are left unconnected at the memory.

FIG. 2 shows the logical organization of the bus 250 and indicates the connections made to the bus 250 by memories of various sizes. FIG. 2 assumes that a memory of size of $2^N$ locations is the smallest memory designated for use in the computer 100, and that a memory of size $2^M$ locations is the largest memory designated for use in the computer 100, wherein $N+R=M$. Since N and M also represent the number of bits required in an address to designate a unique location 211 of a memory of size $2^N$ and $2^M$, respectively, R represents the range of address bits between N and M required to address memories of sizes between $2^N$ and $2^M$.

N and M are even integers, and hence R is likewise an even integer. A memory of size of $2^N$ or $2^M$ locations such that N or M is an odd integer is for the purposes of the invention treated as a memory of the next largest size $2^N$ or $2^M$ where N or M is an even integer. For example, a memory of size of $2^{15}$ locations is treated herein as a memory of size of $2^{16}$ locations. Hence, N and M will be assumed to take on even integer values only, and any discussion of a value of N or M will likewise subsume the case of the next-smaller odd-integer value.

It can be seen from FIG. 2 that a bus 250 suited for use with memories ranging in size from $2^N$ to $2^M$ locations has (M+R)/2 address leads 251. These leads 251 are designated as $$251(1) - 251\left(\frac{M+R}{2}\right).$$

If the low-order address bits of an address are assumed to represent the row address while the high-order address bits are assumed to represent the column address, the first N/2 address leads 251(1) to 251(N/2) carry the row-address bits 0 through (N/2−1) at time t=0, and carry the column-address bits N/2 through (N−1) at time t=1. At time t=0, the other R address leads $$251\left(\frac{N}{2}+1\right) \text{ to } 251\left(\frac{M+R}{2}\right)$$

carry redundant information and may also carry information about higher-order bits. The redundant information is both a repetition of at least some of the row-address bits 0 through $$\left(\frac{N}{2}-1\right),$$

plus at least some of the initial column address bits N/2 through (N−1), which have become row address bits for memories of size greater than $2^N$. At time t=1, the address leads $$251\left(\frac{N}{2}+1\right) \text{ to } 251\left(\frac{M+R}{2}\right)$$

carry additional column-address bits for memories of size greater than $2^N$. In particular, at time t=0, the leads $$251\left(\frac{N}{2}+1\right) \text{ to } 251\left(\frac{M+R}{2}\right)$$

carry the row address bits 0, N/2, 1, (N/2)+1, and so on to (R/2)−1, and [N+R)/2]−1, respectively. And at time t=1 the leads $$251\left(\frac{N}{2}+1\right) \text{ to } 251\left(\frac{M+R}{2}\right)$$

carry the column-address bits N, N+1, N+2, N+3, and so on to N+R−2, and N+R−1, respectively. A memory 200 of size $2^N$ locations is connected to the first N/2 leads 251(1) to 251(N/2); a memory 200 of size $2^{N+2}$ locations is connected to the (N/2)+1 leads $$251(2) \text{ to } 251\left(\frac{N}{2}+2\right);$$

a memory 200 of size $2^{N+4}$ locations is connected to the N/2+2 leads $$251(3) \text{ to } 251\left(\frac{N}{2} + 4\right):$$

and so on, until a memory 200 of size $2^M$ locations is connected to the last M/2 leads $$251\left(\frac{R}{2} + 1\right) \text{ to } 251\left(\frac{M+R}{2}\right).$$

Hence there are always at least R/2 redundant, unused, leads 251 in the bus 250.

From the above example it can be seen that a memory 200 of any size within the predetermined range, if properly connected to the bus 250, receives all the row-address and column-address bits that it requires, at the proper time, without receiving any redundant address information. When the size of the memory 200 that is being utilized in the computer 100 is changed, the new memory 200 is merely connected to the appropriate set of address leads 251 to achieve addressability of the new memory 200.

A particular example of the general scheme just discussed in conjunction with FIG. 2 is shown in FIG. 3. FIG. 3 shows the organization of a bus 250 adapted for connection to memories of size 64K, i.e., $2^{16}$, and 256K, i.e., $2^{18}$, memory locations. As was mentioned above, such bus 250 would likewise be used with memories of size 32K, i.e., $2^{15}$, and 128K, i.e., $2^{17}$, memory locations. The bus 250 has ten leads 251(1) to 251(10). The leads 251(1) to 251(8) carry row address bits 0–7, respectively, at time t=0, and column address bits 8–15, respectively, at time t=1. The leads 251(9) and 251(10) carry the row address bits 0 and 8, respectively, at time t=0 and the column address bits 16 and 17, respectively, at time t=1. Which lead 251(9) and 251(10) carries which row and column address is immaterial in this example. A memory 200 of size 32K or 64K connects to leads 251(1) through 251(8), while a memory 200 of size 128K or 256K connects to leads 251(2) through 251(10).

Returning to consideration of FIG. 1, multiplexing of the bits of an address appearing on the system bus 410 onto the multiplexed-address bus 250 is done by the memory controller 300. In addition, the memory controller 300 controls the operation of the memory 200 and its interactions with other devices of the computer 100. However, the memory controller 300 is a conventional device and therefore its structure and operation will not be discussed in detail. Only the portions thereof relevant to an understanding of the invention will be discussed.

The memory controller 300 forms an interface between the system bus 410 and the memory 200. The system bus 410 is connected to an input port 310 of the memory controller 300. Each of the address leads 412 of the system bus 410 is connected to an input terminal 312 of the port 310. The terminals 312 are in turn connected to inputs of a two-to-one address multiplexer 320. The multiplexed-address bus 250 and data and control leads 252 extend to the memory 200 and are connected to an output port 313 of the memory controller 300. Each of the multiplexed-address leads 251 of the bus 250 is connected to an output terminal 314 of the port 313. The terminals 314 are connected to outputs of the multiplexer 320.

The multiplexer 320 is in structure and operational characteristics a conventional device. It comprises a row address buffer 322 and a column address buffer 321, each one of which functionally acts as a gate. Each of the buffers 321 and 322 has an Enable (EN) input. The enable input of the row address buffer 322 is connected to a source (not shown) of row enable (ROWEN) signals. The enable input of the column address buffer 321 is connected to a source (not shown) of column enable (COLEN) signals. Receipt of an enable signal causes a buffer 321 or 322 to transfer address-bit signals present at its inputs to its outputs. The buffers 322 and 321 receive their enable signals at different times t2 and t3, respectively. Time t2 precedes time t0, described above in conjunction with the memory 200, while time t3 succeeds time t0 and precedes time t1, also described above in conjunction with the memory 200.

Each buffer 321 and 322 has as many outputs as there are multiplexed-address leads 251 in the bus 250. Outputs of the buffers 321 and 322 are connected in parallel to the output terminals 314 of the memory controller 300. Each lead 251 of the bus 250 is thus connected to one output of each of the buffers 321 and 322. Each buffer output has a corresponding buffer input. Hence each buffer 321 and 322 has as many inputs as there are leads 251 in the bus 250.

In order to multiplex address bits on the bus 250 according to the arrangement shown in FIGS. 2 or 3, the inputs of the buffers 321 and 322 must be connected to the address-bit-carrying leads 412 of the system address bus 410 according to the same arrangement. Hence FIG. 2 and FIG. 3 show two examples of the connective arrangement of both inputs and outputs of the buffers 321 and 322 to the system address leads 412.

Turning to FIG. 2, the top half of the figure represents inputs and (because of their one-to-one correspondence to the outputs) simultaneously the outputs of the row address buffer 322. The inputs and corresponding outputs of the buffer 322 are designated by the numerals 1 through (M+R)/2.

Similarly, the bottom half of the figure represents the inputs and outputs of the column-address buffer 321, designated by the same numerals 1 through (M+R)/2. The individual outputs of the buffers 321 and 322 are connected to the leads 251 of the bus 250 that bear the same numerical designation. The inputs of the buffers 321 and 322 are connected to the leads 412 of the system bus 410 that carry the corresponding address bit. Thus the inputs 1 through N/2 of the buffer 322 are connected to leads 412 that carry the address bits 0 through (N/2)−1, respectively. The remaining inputs (N/2)+1 through (M+R)/2 of the buffer 322 are connected to leads 412 that carry the address bits 0, N/2, 1, (N/2)+1, and so on, up to (R−1)/2, and [(N+R)/2]−1, respectively. And the inputs 1 through (M+R)/2 of the buffer 321 are connected to leads 412 that carry the address bits N/2 through N+R−1, respectively.

Turning again to the particular example of FIG. 3, it may be seen therefrom that in a computer 100 adapted to use either 64K memories or 256K memories, each buffer 321 and 322 has 10 inputs and 10 outputs numbered 1 through 10. The outputs 1 through 10 of the buffers 321 and 322 are connected to the leads 251(1) through 251(10), respectively, of the bus 250. The inputs 1 through 10 of the buffer 322 are connected to system address leads 412 that carry address bits 0 through 7, 0, and 8, respectively. And the inputs 1 through 10 of the buffer 321 are connected to system address leads 412 that carry address bits 8 through 17, respectively.

Of course, various changes and modifications to the illustrative embodiment described above will be apparent to those skilled in the art. For example, the mapping of the address bits onto the particular address leads of the multiplexed-address bus may be varied. Or the leads of the multiplexed-address bus that are not connected to a memory may be omitted from the system and may be added only when they become needed. Such changes and modifications can be made without departing from the spirit and the scope of the invention and without diminishing its attendant advantages. It is therefore intended that such changes and modifications be covered by the following claims.

What is claimed is:

1. An information storage system for storing information in, or retrieving stored information from, any memory selected from a plurality of memories ranging in size from $2^N$ memory locations to $2^{N+R}$ memory locations, wherein N and R are positive even integers, the system comprising:

a memory of any size of $2^{S*}$ memory locations selected from the plurality of memories, wherein S* is a positive integer, for storing information in, or retrieving stored information from, an addressed location in response to receiving the location's address, the memory having S/2 time-multiplexed address input terminals for receiving the address of a memory location in two time-multiplexed sets of S/2 address bits wherein S equals S* if S* is an even integer and equals S*+1 if S* is an odd integer;

means for generating a plurality of address bits forming an address of a memory location to store information in the selected memory or to retrieve stored information from the selected memory;

multiplexing means connected to the address-generating means to receive therefrom the generated address bits and having (N/2)+R address output terminals for time-multiplexing thereon address information including memory location addresses of all memories of size in the range in two sets of (N/2)+R received address bits having at least R/2 bits in common such that for every value of S* there is an associated address output terminal subset comprising S/2 of the output terminals and having multiplexed thereon the two sets of bits comprising a location address of a memory of size $2^{S*}$, each of the subsets having at least one output terminal in common with another of the subsets; and an address bus having S/2 address leads connected between the S/2 address input terminals of the selected memory and the S/2 address output terminals of the selected memory's associated subset, for transporting the memory location address to the selected memory.

2. System of claim 1 wherein the multiplexing means comprise:

first buffer means having (N/2)+R inputs for receiving from the generating means a first of the two sets of (N/2)+R address bits, and having (N/2)+R outputs connected to the output terminals for outputting at a time the first set of address bits onto the output terminals; and second buffer means having (N/2)+R inputs for receiving from the generating means a second of the two sets of (N/2)+R address bits, and having (N/2)+R outputs connected to the output terminals for outputting at another time the second set of address bits onto the output terminals.

3. The system of claim 1 wherein the plurality of address bits forming an address of a memory location comprise memory array row address bits and memory array column address bits, and wherein the two sets of (N/2)+R bits multiplexed on the (N/2)+R address output terminals comprise a set of the row address bits of all memories of sizes within the range and a set of the column address bits of all memories of sizes within the range.

4. An information storage system for storing information in, or retrieving stored information from, any memory selected from a plurality of memories ranging in size from $2^N$ memory locations to $2^{N+R}$ memory locations, where N and R are positive even integers, the system comprising:

a memory of any size of $2^{S*}$ memory locations selected from the plurality of memories, where S* is a positive integer, for storing information in, or retrieving stored information from, an addressed location in response to receiving the location's address, the memory having S/2 time-multiplexed address input terminals for receiving the address of a memory location in two time-multiplexed sets of S/2 address bits wherein S equals S* if S* is an even integer and equals S*+1 if S* is an odd integer;

means for generating a plurality of address bits forming an address of a memory location to store information in the selected memory or to retrieve stored information from the selected memory;

multiplexing means connected to the address-generating means to receive therefrom the generated address bits, and having (N/2)+R address output terminals for time-multiplexing thereon address information including memory location address of all memories of size in the range in two sets of (N/2)+R received address bits having at least R/2 bits in common such that for every value of S* there is an associated address output terminal subset comprising S/2 of the output terminals and having multiplexed thereon the two sets of bits comprising a location address of a memory of size $2^{S*}$, each of the subsets having at least one output terminal in common with another of the subsets; and an address bus having (N/2)+R address leads connected to the (N/2)+R output address terminals for transporting the multiplexed memory location address of any memory of size in the range to the memory of that size, the bus having S/2 leads connecting the S/2 address output terminals of the selected memory's associated subset with the S/2 address input terminals of the selected memory.

5. The system of claim 4 wherein the multiplexing means comprise:

first buffer means having (N/2)+R inputs for receiving from the generating means a first of the two sets of (N/2)+R address bits, and having (N/2)+R outputs connected to the output terminals for outputting at a time the first set of address bits onto the output terminals; and second buffer means having $(N/2)+R$ inputs for receiving from the generating means a second of the two sets of $N/2+R$ address bits, and having $(N/2)+R$ outputs connected to the output terminals for outputting at another time the second set of address bits onto the output terminals.

6. The system of claim 4 wherein the plurality of address bits forming an address of a memory location comprise memory array row address bits and memory array column address bits, and wherein the two sets of $(N/2)+R$ bits multiplexed on the $(N/2)+R$ address output terminals comprise a set of the row address bits of all memories of sizes within the range and a set of the column address bits of all memories of sizes within the range.

7. Apparatus for interfacing a memory address to a memory of any size of $2^{S*}$ memory locations selected from a plurality of memories ranging in size from $2^N$ memory locations to $2^{N+R}$ memory locations, where $S^*$ is a positive integer and N and R are positive even integers, the selected memory having S/2 time-multiplexed address input terminals for receiving the address of a memory location in two time multiplexed sets of S/2 address bits, wherein S equals $S^*$ if $S^*$ is an even integer and equals $S^*+1$ if $S^*$ is an odd integer, the apparatus comprising:

multiplexing means having address input terminals for receiving a memory address and $(N/2)+R$ address output terminals for time-multiplexing thereon address information including memory location addresses of all memories of size in the range in two sets of $(N/2)+R$ received address bits having at least R/2 bits in common such that for every value of $S^*$ there is an associated address output terminal subset comprising S/2 of the output terminals and having multiplexed thereon the two sets of bits comprising a location address of a memory of size $2^{S*}$, each of the subsets having at least one output terminal in common with another of the subsets; and an address bus having S/2 address leads for connection to the S/2 address input terminals of the selected memory of $2^{S*}$ locations and having the S/2 address leads connected to the S/2 address output terminals of the selected memory's associated subset, for transporting the memory location address to the selected memory.

8. The apparatus of claim 7 wherein the multiplexing means comprise:

first buffer means having $(N/2)+R$ inputs for receiving from address generating means a first of the two sets of $(N/2)+R$ address bits, and having $(N/2)+R$ outputs connected to the output terminals for outputting at a time the first set of address bits onto the output terminals; and second buffer means having $(N/2)+R$ inputs for receiving from address generating means a second of the two sets of $(N/2)+R$ address bits, and having $(N/2)+R$ outputs connected to the output terminals for outputting at another time the second set of address bits onto the output terminals.

9. The apparatus of claim 7 wherein the plurality of address bits forming an address of a memory location comprise memory array row address bits and memory array column address bits, and wherein the two sets of $(N/2)+R$ bits multiplexed on the $(N/2)+R$ address output terminals comprise a set of the row address bits of all memories of sizes within the range and a set of the column address bits of all memories of sizes within the range.

10. Apparatus for interfacing a memory address to a memory of any size of $2^{S*}$ memory locations selected from a plurality of memories ranging in size from $2^N$ memory locations to $2^{N+R}$ memory locations, wherein $S^*$ is a positive integer and N and R are positive even integers, the selected memory having S/2 time-multiplexed address input terminals for receiving the address of a memory location in two time multiplexed sets of (S/2) address bits, wherein S equals $S^*$ is an even integer and equals $S^*+1$ if $S^*$ is an odd integer, the apparatus comprising:

multiplexing means having address input terminals for receiving a memory address and $(N/2)+R$ address output terminals for time-multiplexing thereon address information including memory location addresses of all memories of size in the range in two sets of $(N/2)+R$ received address bits having at least R/2 bits in common such that for every value of $S^*$ there is an associated address output terminal subset comprising S/2 of the address output terminals and having multiplexed thereon the two sets of bits comprising a location address of a memory of size $2^{S*}$, each of the subsets having at least one output terminal in common with another of the subsets; and an address bus having $(N/2)+R$ address leads connected to the $(N/2)+R$ output address terminals for transporting the multiplexed memory location address of any memory of size in the range to the memory of that size, the bus having for connection to the S/2 address input terminals of the selected memory of $2^{S*}$ locations those S/2 leads which are connected to the address output terminals of the selected memory's associated subset, to transport the multiplexed memory location address to the selected memory.

11. The apparatus of claim 10 wherein the multiplexing means comprise:

first buffer means having $(N/2)+R$ inputs for receiving from address generating means a first of the two sets of $(N/2)+R$ address bits, and having $(N/2)+R$ outputs connected to the output terminals for outputting at a time the first set of address bits onto the output terminals; and second buffer means having $(N/2)+R$ inputs for receiving from address generating means a second of the two sets of $(N/2)+R$ address bits, and having $(N/2)+R$ outputs connected to the output terminals for outputting at another time the second set of address bits onto the output terminals.

12. The apparatus of claim 10 wherein the plurality of address bits forming an address of a memory location comprise memory array row address bits and memory array column address bits, and wherein the two sets of $(N/2)+R$ bits multiplexed on the $(N/2)+R$ address output terminals comprise a set of the row address bits of all memories of sizes within the range and a set of the column address bits of all memories of sizes within the range.

* * * * *

UNITED STATES PATENT AND TRADEMARK OFFICE
CERTIFICATE OF CORRECTION

PATENT NO. : 4,675,808

DATED : June 23, 1987

INVENTOR(S) : James M. Grinn and Kevin A. McWethy

It is certified that error appears in the above-identified patent and that said Letters Patent is hereby corrected as shown below:

Column 10 line 34, "location address" should read "location addresses".

Column 12, line 14, "equals S* is an even" should read "equals S* if S* is an even".

Signed and Sealed this

Eighth Day of September, 1992

Attest:

DOUGLAS B. COMER

*Attesting Officer*       *Acting Commissioner of Patents and Trademarks*